US007306897B2

(12) United States Patent
Mori

(10) Patent No.: US 7,306,897 B2
(45) Date of Patent: Dec. 11, 2007

(54) PREPARATION METHOD OF PRINTING PLATE MATERIAL AND PRINTING PLATE MATERIAL

(75) Inventor: Takahiro Mori, Hachioji (JP)

(73) Assignee: Konica Minolta Medical & Graphic, Inc., Tokyo (JP)

( * ) Notice: Subject to any disclaimer, the term of this patent is extended or adjusted under 35 U.S.C. 154(b) by 0 days.

(21) Appl. No.: 11/049,349

(22) Filed: Feb. 2, 2005

(65) Prior Publication Data

US 2005/0181308 A1 Aug. 18, 2005

(30) Foreign Application Priority Data

Feb. 12, 2004 (JP) ............................ 2004-034716

(51) Int. Cl.
*G03F 7/004* (2006.01)

(52) U.S. Cl. .................. 430/302; 430/270.1; 430/330; 101/463.1

(58) Field of Classification Search ............ 430/270.1, 430/302, 944, 945, 330; 101/453, 463.1; 427/384
See application file for complete search history.

(56) References Cited

U.S. PATENT DOCUMENTS

| | | | | |
|---|---|---|---|---|
| 5,460,918 | A * | 10/1995 | Ali et al. | 430/200 |
| 6,399,270 | B1 * | 6/2002 | Mori et al. | 430/270.1 |
| 6,420,083 | B1 * | 7/2002 | Kawamura | 430/270.1 |
| 6,427,595 | B1 * | 8/2002 | Van Damme et al. | 101/457 |
| 2003/0010240 | A1 * | 1/2003 | Verschueren et al. | 101/450.1 |
| 2003/0152868 | A1 * | 8/2003 | Hiraoka | 430/303 |
| 2003/0180658 | A1 * | 9/2003 | Goodin et al. | 430/270.1 |
| 2003/0219673 | A1 * | 11/2003 | Tao et al. | 430/163 |
| 2005/0064339 | A1 * | 3/2005 | Miyoshi | 430/300 |

* cited by examiner

*Primary Examiner*—John S. Chu
(74) *Attorney, Agent, or Firm*—Lucas & Mercanti, LLP

(57) ABSTRACT

A method for preparing a printing plate material containing a substrate having thereon a hydrophilic layer, comprising the steps of (i) applying on the substrate an aqueous coating solution for the hydrophilic layer, the coating solution containing colloid of spherical metal oxide particles and having a pH value of 8 to 12 to obtain a coating layer; and (ii) heating the printing plate material so that a surface temperature of the coated layer is raised to 130 to 300° C., so as to dry the coated layer.

8 Claims, No Drawings

PREPARATION METHOD OF PRINTING PLATE MATERIAL AND PRINTING PLATE MATERIAL

FIELD OF THE INVENTION

The present invention relates to a preparation method of a printing plate material, and specifically to a preparation method of a hydrophilic layer of printing plate material to be used for image forming with a computer to plate (CPT) system.

BACKGROUND OF THE INVENTION

Due to digitization of printing image data, in recent years, printing with a CPT system has been widely adopted in the printing industry. As a result, there has been arisen a demand for a printing plate material for the CTP system, which enables a low coast and easy handling printing while exhibiting printability comparable to that of a Pre-sensitized (PS) plate.

Specifically, there has been arisen a demand for a versatile processless printing plate having a direct imaging (hereafter referred to as DI) function in which development using a specific developer is not required and being available for a DI printer, while providing usability comparative to that of a PS plate.

A thermal processless printing plate material is imagewise exposed employing an infrared laser, with an emission wavelength in the near-infrared to infrared regions, to form an image. The thermal processless printing plate material employing this method is divided into two types; an abrasion type printing plate material and an on-press development type printing plate material with a heat fusible image formation layer.

Examples of the abrasion type printing plate material include those disclosed in for example, Japanese Patent Publication Open to Public Inspection (hereafter referred to as JP-A) Nos. 8-507727, 6-186750, 6-199064, 7-314934, 10-58636 and 10-244773.

These references disclose a printing plate material containing a support provided thereon a hydrophilic layer and an oleophilic layer, either of which is the outermost layer. When a printing plate material having a hydrophilic layer as the outermost layer is imagewise exposed, the hydrophilic layer is removed by abrasion to reveal an oleophilic layer, whereby an image is formed. This printing plate material tends to exhibit the problem that the used exposure device is contaminated by the ablated residue, and a special suction device is required to remove the scattered residue. Therefore, this printing plate material shows relatively lower versatility to the exposure device.

Alternatively, there has been achieved a development of a printing plate material which is capable of forming an image without abrasion, and does not require development treatment employing a special developer or wiping-off treatment. For example, there disclosed is a printing plate material for CTP in Japanese Patent Nos. 2938397 and 2938398, in which a thermosensitive image formation layer contains thermoplastic particles and a water-soluble binder which enables on-press developing by using a dampening solution or a printing ink.

However, when a grained aluminum plate is used as a hydrophilic substrate in the above mentioned on-press developing CTP system, the following problems tend to occur: (i) failure in on-press developing due to the complicated roughness of the grained aluminum plate or (ii) degradation of printing sensitivity or failure in image formation (degradation of printing durability) due to the high conductivity of the grained aluminum plate. Accordingly, it has been relatively difficult to satisfy the following three requirements: (i) on-press developing property; (ii) high printing sensitivity; and (iii) high printing durability.

Also proposed is a printing plate material having a hydrophilic layer on a support which further having thereon a water soluble layer containing a light-to-heat conversion material. Since the surface asperity of the hydrophilic layer of this printing plate material is easily controlled by selecting the size or amount of the contained particles, this printing plate material has the advantage in that a favorable surface asperity for on-press developing is easily obtained (for example, see Patent Document 1).

However, even in this printing plate material, problems of stain in non-image areas or insufficient printing durability may be found, under a certain printing condition.

Further proposed is a highly durable hydrophilic layer containing 91% by weight or more, preferably 95% by weight or more of a material which does not contain carbon (for example, see Patent Document 2). This hydrophilic layer exhibits several favorable printing properties, for example: (i) no stain in non-image area is observed even when a dampening solution containing no IPA (isopropanol); and (ii) a high anti-abrasion property and high printing durability are obtained, since it contains only a small amount of water soluble resins (the main component of the layer being metal oxide).

However, in recent years, higher printing durability is demanded in a thermal processless CTP system, and the printing durability of the above printing plate materials has become relatively insufficient.

(Patent Document 1)

JP-A No. 2001-105759

(Patent Document 2)

JP-A No. 2002-370465

SUMMARY OF THE INVENTION

An object of the present invention is to provide a printing plate material having superior printing properties and printing durability and to provide a method for preparing the above mentioned printing plate material.

One embodiment of the present invention is a method for preparing a printing plate material containing a substrate having thereon a hydrophilic layer, comprising the steps of: (i) applying on the substrate an aqueous coating solution for the hydrophilic layer, the coating solution containing colloid of spherical metal oxide particles and having a pH value within a specified range to obtain a coating layer; and (ii) heating the printing plate material so that a surface temperature of the coated layer is raised to a temperature within a specified range, so as to dry the coated layer.

DESCRIPTION OF THE PREFERRED EMBODIMENTS

The above object of the present invention is achieved by the following structures.

(1) A method for preparing a printing plate material containing a substrate having thereon a hydrophilic layer, comprising the steps of:

(i) applying on the substrate an aqueous coating solution for the hydrophilic layer, the coating solution containing colloid of spherical metal oxide particles and having a pH value of 8 to 12 to obtain a coating layer; and (ii) heating the printing plate material so that a surface temperature of the coated layer is raised to 130 to 300° C., so as to dry the coated layer.

(2) The method of Item (1), wherein the spherical metal oxide particles are colloidal silica.

(3) The method of Item (1) or Item (2), wherein diameters of the spherical metal oxide particles are in the range of 1 to 15 nm.

(4) The method of any one of Items (1) to (3), wherein the aqueous coating solution for the hydrophilic layer contains a light-to-heat conversion material and in the step (ii), the heating is carried out by irradiating with infra-red rays.

(5) The method of Item (4), wherein the light-to-heat conversion material is made of particles of carbon black, graphite, metal or a metal containing compound.

(6) The method of Item (5), wherein the metal containing compound is a metal oxide.

(7) The method of any one of Items (1) to (6), wherein the support is a plastic film.

(8) The printing plate material prepared by the method of any one of Items (1) to (7).

The above mentioned structures of the present invention provide: (i) a printing plate material exhibiting superior initial printability, superior printing properties and excellent printing durability; and (ii) a method for preparing the above mentioned printing plate.

The present invention is characterized in that a hydrophilic layer is formed by applying on the substrate an aqueous coating solution for the hydrophilic layer, which contains colloid of spherical metal oxide particles and having a pH value of 8 to 12, followed by heating the printing plate material so that the surface temperature of the coated layer is raised to 130 to 300° C.

The present invention is specifically characterized in that the hydrophilic layer contains spherical metal oxide particles as a hydrophilic material and that the coated hydrophilic layer is heated to a temperature range of 130 to 300° C.

The printing durability of the printing plate material containing the hydrophilic layer can be improved without losing the initial printability, by applying on the substrate an aqueous coating solution containing colloid of spherical metal oxide particles, exhibiting a pH value of 8 to 12, followed by heating the printing plate material so that the surface temperature of the coated layer is raised to 130 to 300° C.

The required surface temperature of the coated layer is 130 to 300° C., however, it is preferably 150° C. or more, and more preferably 170° C. or more.

The heating duration at 130° C. is preferably 1 to 1200 seconds, in that, the shorter duration is enough for the higher heating temperature to obtained sufficient layer strength. At heating temperatures higher than 200° C., heating duration of several seconds to several tens of seconds results in sufficient coated layer strength.

The surface temperature of the coated layer is measured using a commercial non-contact thermometer.

The aqueous coating solution of the present invention means that 80% by weight or more of the solvent is water.

In the present invention, it is preferable that 90% by weight or more of the solvent is water, and more preferably, the solvent is substantially water.

The pH value of the aqueous coating solution is required to be within 8 to 12, however, more preferably it is within 9 to 11, in order to improve printing durability and stability of the coating solution,.

To “contain colloid of spherical metal oxide particles” means that spherical metal oxide particles are contained in a dispersed state in the coating solution, and “a spherical metal oxide particle” means that the particle has an acicular ratio of 1 to 1.5, where the acicular ratio denotes a ratio of (major axis length/minor axis length) of a particle, and both length being measured from a SEM image.

Any metal oxide colloid may be suitably used provided that the colloid is stable in an aqueous coating solution having a pH of 8 to 12, however, colloidal silica is specifically preferable.

The particle diameter is preferably 1 to 15 nm and more preferably 1 to 10 nm, in order to enhance the strength of the coated layer.

Herein, the particle diameter represents the primary particle diameter.

The particle diameter represents a diameter of a circle having the same area as the projected area of a particle.

As a metal oxide colloid having particle diameter of 15 nm or less and being stable in an aqueous solution of pH 8 to 12, known are SNOWTEX-S (particle diameter: 8 to 11 nm), SNOWTEX-NS (particle diameter: 8 to 11 nm), SNOWTEX-XS (particle diameter: 4 to 6 nm) and SNOWTEX-NXS (particle diameter: 4 to 6 nm), produced by Nissan Kagaku Kogyo, Co., Ltd.

The dried weight of the coated hydrophilic layer of the present invention is preferably 0.1 to 20 $g/m^2$, more preferably 0.5 to 15 $g/m^2$ and still more preferably 1 to 10 $g/m^2$.

The content of the spherical metal oxide particles is preferably 30 to 100% by weight and more preferably 50 to 100% by weight.

The hydrophilic layer may contain a plurality of layers.

Any known coating methods are applicable for forming the hydrophilic layer of the present invention provided that they allow a uniform coating of the above described amounts of layer.

The heating process of the hydrophilic layer may be conducted: (i) at the same time as the drying process to form the coated layer or subsequently after the drying process, or (ii) after the coated layer was dried and once cooled to an ambient temperature.

The temperature for drying to form the coated layer is preferably 30 to 300° C. and the duration of drying is preferably 0.1 seconds to 10 minutes.

The heating process may be stepwise or continuous.

The hydrophilic layer of the present invention contains spherical metal oxide particles as a hydrophilic material and it may further contain other material which will now be described:

(Porosity Providing Material)

The hydrophilic layer in the present invention may contain necklace-shaped colloidal silica and porous metal oxide particles as a porosity providing material. Since the hydrophilic layer of the present invention has good water retention, even if it is less porous, the porosity providing material content of the hydrophilic layer is preferably from 0 to 30% by weight, and more preferably from 0 to 15% by weight.

<Necklace-Shaped Colloid>

The “necklace-shaped colloidal silica-to be used in the present invention” means a “pearl-necklace configurated” colloidal silica formed by connecting spherical colloidal silica particles each having a primary particle diameter of 10 to 50 μm, so as to attain a length of 50 to 400 nm.

The term “pearl-necklace configurated” means that the image of connected colloidal silica particles is similar to the shape of a pearl necklace. The bonding between the silica particles forming the necklace configurated colloidal silica is thought to be —Si—O—Si—, which is formed by dehydration of —SiOH groups located on the surface of the silica particles. Specific examples of the necklace configurated colloidal silica include SNOWTEX-PS series, produced by Nissan Kagaku Kogyo, Co., Ltd.

Examples of the products include: SNOWTEX-PS-S (the average particle diameter in the connected state is approximately 110 nm), SNOWTEX-PS-M (the average particle diameter in the connected state is approximately 120 nm), and SNOWTEX-PS-L (the average particle diameter in the connected state is approximately 170 nm). Acidic colloidal silicas corresponding to each of the above-mentioned products are SNOWTEX-PS-S-O, SNOWTEX-PS-M-O and SNOWTEX-PS-L-O respectively. Among them, the use of SNOWTEX-PS-S, SNOWTEX-PS-M or SNOWTEX-PS-L, each being alkaline colloidal silica particles, is specifically preferable in the present invention.

The hydrophilic layer in the present invention can contain porous metal oxide particles as another porosity providing material. Examples of the porous metal oxide particles include porous silica particles, porous aluminosilicate particles and zeolite particles which will be described later.

<Porous Silica Particles and Porous Aluminosilicate Particles>

The porous silica particles are ordinarily produced by either a wet method or a dry method. By the wet method, the porous silica particles can be obtained by drying and pulverizing a gel prepared by neutralizing an aqueous silicate solution, or pulverizing the precipitate formed by neutralization. By the dry method, the porous silica particles are prepared by combustion of silicon tetrachloride together with hydrogen and oxygen to deposit silica. The porosity and the particle size of such particles can be controlled by variation of the production conditions.

The porous silica particles prepared from the gel by the wet method are specifically preferred.

The porous aluminosilicate particles can be prepared by the method described in, for example, JP-A No. 10-71764. Thus prepared aluminosilicate particles are amorphous complex particles synthesized by hydrolysis of aluminum alkoxide and silicon alkoxide as the major components. The particles can be synthesized so that the ratio of alumina to silica in the particles is within the range from 1:4 to 4:1. Composite particles composed of three or more components prepared by an addition of another metal alkoxide may also be used in the present invention. In such a particle, the porosity and the particle size can be controlled by adjustment of the production conditions.

The porosity of the particles is preferably not less than 1.0 ml/g, more preferably not less than 1.2 ml/g, and still more preferably 1.8 to 2.5 ml/g, in terms of pore volume before the dispersion.

The pore volume is closely related to water retention of the coated layer. As the pore volume increases, the water retention is increased, stain is difficult to occur, and water tolerance becomes high. However, particles having a pore volume of more than 2.5 ml/g are brittle, resulting in lowering of durability of the layer containing them. Particles having a pore volume of less than 1.0 ml/g result in lowering of anti-stain property or water tolerance in printing. The particle diameter of the particles dispersed in the hydrophilic layer (or in the dispersed state before formed as a layer) is preferably not more than 1 μm, and more preferably not more than 0.5 μm. Presence in the hydrophilic layer of particles with an extremely large size forms porous and sharp protrusions on the hydrophilic layer surface, and ink is likely to remain around the protrusions, which may produce stain at non-image portions of the printing plate and on the blanket of a press during printing.

<Zeolite Particles>

Zeolite is a crystalline aluminosilicate, which is a porous material having voids of a diameter 0.3 to 1 nm in a regular three dimensional network structure.

<Protrusion Formation Particles>

The hydrophilic layer of the present invention may contain, as protrusion formation particles, inorganic particles with a particle diameter of not less than 1 μm, or inorganic material coated particles. Examples of the inorganic particles include particles of known metal oxides such as silica, alumina, titania and zirconia.

Porous metal oxide particles are preferably used in order to prevent sedimentation of the particles in the coating solution.

The porous particles as described above, for example, porous silica particles, porous aluminosilicate particles or zeolite particles are preferably used as the protrusion formation particles.

Inorganic material coated particles include, for example, particles in which organic particles such as PMMA or polystyrene particles as core particles are coated with inorganic particles being smaller than the core particles. The particle diameter of the inorganic particles is preferably from 1/10 to 1/100 of that of the core particles. As the inorganic particles, particles of known metal oxides, for example, silica, alumina, titania and zirconia can be used.

Various known coating methods can be used, and a dry process is preferably employed, in which core particles collide with coating particles at high speed in air as in a hybridizer to have the coating particles penetrate the core particle surface, and to be fixed, whereby the core particles are coated with coating particles.

Particles prepared by plating the surface of organic core particles with metal may also be used. As such particles, there is, for example, "Micropearl AU", produced by SEKISUI KAGAKU KOGYO Co, Ltd., in which resin particles are plated with gold.

The hydrophilic layer of the present invention may contain, as protrusion formation particles, hydrophilic organic particles with a particle diameter of not less than 1 μm. Examples of the hydrophilic organic particles include calcium alginate particles and chitosan particles. Of these, the chitosan particles are preferably used, since they improve dispersion stability of particles and coatability of the hydrophilic layer.

The particle diameter of the protrusion formation particles is preferably from 1 to 10 μm, more preferably from 1.5 to 8 μm, and still more preferably from 2 to 6 μm.

<Layer Structural Clay Mineral Particles>

The hydrophilic layer of the printing plate material of the present invention may contain layer structural clay mineral particles as a metal oxide. Examples of the layer structural mineral particles include a clay mineral, for example, kaolinite, halloysite, talc, smectite (for example, montmorillonite, beidellite, hectorite and saponite), vermiculite, mica and chlorite; hydrotalcite; and a layer structural polysilicate (for example, kanemite, makatite, ilerite, magadiite and kenyte). Among these, the particles having a higher electric charge density in the unit layer, exhibit higher polarity and hydrophilicity. Preferable charge density is not less than 0.25, more preferably not less than 0.6. Examples of the layer structural mineral particles having such charge density include smectite having a negative charge density of 0.25 to 0.6 and bermiculite having a negative charge density of 0.6 to 0.9. Synthesized fluorinated mica is preferable since it has a stable quality, for example, uniform particle size. Among the synthesized fluorinated mica, preferable is swellable mica and more preferable is freely swellable mica.

Also usable are an intercalation compound of the foregoing layer structural mineral particles and the layer structural mineral particles subjected to the following treatments: (i) ion exchange treatment; or (ii) a surface treatment such as a silane coupling treatment or a complexication treatment with an organic binder.

The average particle length (an average of the largest particle length) of the planar layered mineral particles in the condition of being contained in the hydrophilic layer is preferably not more than 20 μm. The average aspect ratio (the largest particle length/the particle thickness) is preferably not less than 20. The above mentioned average particle length and average aspect ratio contain the values which are measured while the particles are being subjected to a swelling process or a dispersing layer-separation process. More preferably the average particle length is not more than 5 μm and the average aspect ratio is not less than 50, and still more preferably the average particle length is not more than 1 μm and the average aspect ratio is not less than 50. When the particle length is within the foregoing range, a strong dry coated layer which is resistant to cracking is obtained, because continuity in the parallel direction, and flexibility, which are traits of the layer structural particles, are given to the coated layer. In a coating solution containing a large amount of particle materials, the viscosity increasing effect of the layer structural mineral particles may minimize particle sedimentation in the coating solution.

When the particle length is out of the above described range, the scratch resistance of the layer may be degraded while when the aspect ration is lower than the above described range, flexibility of the layer may be reduced and scratch resistance may also be degraded.

The content of the layer structural mineral particles is preferably from 0.1 to 30% by weight, and more preferably from 1 to 10% by weight based on the total weight of the layer. Specifically, the addition of swellable synthesized fluorinated mica or smectite is effective even when the added amount is small. The layer structural mineral particles may be added in the form of a powder to the coating liquid, however, preferable is to add it in the form of a gel, which is formed by swelling the layer structural mineral particles in water, to the coating liquid. Using the gel, good dispersity is obtained with an easy coating liquid preparation method which requires no dispersion process, for example, dispersion due to media.

<Other Materials>

An aqueous solution of a silicate is also usable as another additive to the hydrophilic layer of the present invention. An alkali metal silicate, for example, sodium silicate, potassium silicate or lithium silicate is preferable, and the $SiO_2/M_2O$ is preferably selected so that the pH value of the coating liquid after addition of the silicate does not exceed 13, which prevents dissolution of the inorganic particles.

An inorganic polymer or an inorganic-organic hybrid polymer prepared by a sol-gel method employing a metal alkoxide is also usable. Known methods, as described in S. Sakka "Application of Sol-Gel Methods" or in the publications cited in the above publication can be applied to prepare the inorganic polymer or the inorganic-organic hybridpolymer by the sol-gel method.

In the present invention, the hydrophilic layer may contain a water soluble resin or a water dispersible resin. Examples thereof include polysaccharides, polyethylene oxide, polypropylene oxide, polyvinyl alcohol, polyethylene glycol (PEG), polyvinyl ether, a styrene-butadiene copolymer, a conjugated diene polymer latex of methyl methacrylate-butadiene copolymer, an acryl polymer latex, a vinyl polymer latex, polyacrylamide, and polyvinyl pyrrolidone.

As the polysaccharide, starches, celluloses, polyuronic acid and pullulan may be used. Among them, a cellulose derivative such as a methyl cellulose salt, a carboxymethyl cellulose salt or a hydroxyethyl cellulose salt is preferable, and a sodium or ammonium salt of carboxymethyl cellulose is more preferable.

A water-soluble surfactant may be added to improve the coating ability of the coating liquid for the hydrophilic layer of the present invention. A silicon-containing surfactant, a fluorine-containing surfactant and a acetylene glycol surfactant are preferably used. The silicon atom-containing surfactant is specifically preferred in that it minimizes printing contamination. The content of the surfactant is preferably from 0.01 to 3% by weight, and more preferably from 0.03 to 1% by weight based on the total weight of the hydrophilic layer (or the solid content in the coating liquid).

The hydrophilic layer of the present invention may contain a phosphate. Since a coating liquid for the hydrophilic layer is preferably alkaline, the phosphate to be added to the hydrophilic layer is preferably trisodium phosphate or disodium monohydrogen phosphate. The addition of the phosphate provides improved reproduction of half-tone dots at shadow portions. The content of the phosphate is preferably from 0.1 to 5% by weight, and more preferably from 0.5 to 2% by weight in terms of the amount excluding hydrated water.

<Support>

As the support, well known materials in the art as a support for a printing plate can be used. Examples of the support include a metal plate, a plastic film sheet, a paper sheet treated with polyolefin, and composite materials thereof. The thickness of the support is not specifically limited as long as a printing plate having the support can be mounted on a printing press, however, it is preferably 50 to 500 μm with respect to easily handling.

Examples of metals for the metal support include iron, stainless steel, and aluminum. Of these, aluminum is specifically preferable with respect to the relationship between weight and stiffness.

An aluminum plate is usually used after degreased with an alkali, an acid or a solvent to remove oil on the surface, which has been used when rolled and wound around a spool. Degreasing with an alkali solution is specifically preferable. In order to increase adhesion between the support and a coating layer, it is preferable that the surface of the support is subjected to an adhesion increasing treatment or under coating.

For example, the support is immersed in a solution containing silicate or a coupling agent such as a silane coupling agent, or the support is coated with the solution and then sufficiently dried.

An anodization treatment is considered to be one kind of adhesion increasing treatment, and also applicable. The anodization treatment and the immersing or coating treatment described above can be used in combination. An so-called grained aluminum plate, which has been surface-roughened with a conventional method, can also be used as a support having a hydrophilic surface.

Examples of the plastic film include a polyethylene terephthalate film, a polyethylene naphthalate film, a polyimide film, a polyamide film, a polycarbonate film, a polysulfone film, a polyphenylene oxide film, and a cellulose ester film. Of these, the polyethylene terephthalate film and the polyethylene naphthalate film are preferable. The present invention is specifically effective when a plastic film is used as a support.

In order to increase adhesion between the support and a coating layer, it is preferable that the surface of the plastic film is subjected to adhesion increasing treatment or under coating. Examples of the adhesion increasing treatment include a corona discharge treatment, a flame treatment, a plasma treatment and a UV light irradiation treatment. Examples of the under coat layer include a layer containing gelatin and a layer containing latex. The under coat layer can contain a known organic or inorganic electrically conductive material.

A support provided with a back coat layer having a roughened surface, or containing a known conductive material, is also preferably applicable to reduce slippage of the support. Examples of the coating method of the hydrophilic layer include commonly known coating methods, for example, bar coating, roll coating and extrusion coating.

(Image Forming)

The structure of the printing plate material of the present invention includes a support having thereon at least one hydrophilic layer as one of the constituting layers. The method of image forming is not specifically limited in the present invention.

For example, a printing plate material is prepared by forming an image using an oleophilic material by means of common ink-jet printing methods known in the art.

The hydrophilic layer of the present invention may also be used as a hydrophilic layer in the abrasion type processless CTP.

One of the specifically preferable embodiments of the present invention is a hydrophilic layer used in an on-press processless CTP system, where an image forming layer capable of on-press developing to be described later is formed on the hydrophilic layer.

In any of the types of the above described printing plate materials, the printing durability is improved by using the hydrophilic layer prepared by the method of the present invention.

(An Embodiment Containing Light-to-Heat Conversion Material)

One of the more preferable embodiments of the present invention is that the aqueous coating solution (an aqueous solution of pH 8 to 12, containing spherical colloidal particles of metal oxide) of the hydrophilic layer further contains a light-to-heat conversion material, and that the printing plate material is heated via irradiation of infrared rays.

An advantage of this embodiment is that the temperature of the hydrophilic layer can be raised higher than the environmental temperature, since the hydrophilic layer is heated by the heat generated by the light-to-heat conversion material contained in the hydrophilic layer, when the hydrophilic layer is irradiated with infrared rays.

In this embodiment, even when a plastic film is used as the support, damage to the plastic film support (for example, local extension or transformation, or decrease in elasticity) is minimized, because the temperature of the hydrophilic layer can be raised while the increase in the temperature of the support is suppressed.

Also in this embodiment, the hydrophilic layer may contain a plurality of layers, and, in that case, at least one layer contains a light-to-heat conversion material.

As a light-to-heat conversion material, infrared ray-absorbing dyes known in the art are applicable.

Examples of the infrared absorbing dye include: general organic infrared absorbing dyes, for example, a cyanine dye, a chloconium dye, a polymethine dye, an azulenium dye, a squalenium dye, a thiopyrylium dye, a naphthoquinone dye and an anthraquinone dye; and organometallic complexes, for example, a phthalocyanine compound, a naphthalocyanine compound, an azo compound, a thioamide compound, a dithiol compound and an indoaniline compound. Specific examples are disclosed, for example, in JP-A Nos. 63-139191, 64-33547, 1-160683, 1-280750, 1-293342, 2-2074, 3-26593, 3-30991, 3-34891, 3-36093, 3-36094, 3-36095, 3-42281, 3-97589 and 3-103476. These compounds may be used alone or in combination.

Compounds described in JP-A Nos. 11-240270, 11-265062, 2000-309174, 2002-49147, 2001-162965, 2002-144750, and 2001-219667 are also preferably applicable.

In the present invention, the light-to-heat conversion material is preferably stable at 300° C. Examples of the light-to-heat conversion materials stable at 300° C. include particles of carbon black, graphite, metal and a metal containing oxide.

Examples of preferable carbon black include furnace black and acetylene black. The graininess ($d_{50}$) thereof is preferably not more than 100 nm, and more preferably not more than 50 nm.

The particle diameter of graphite is preferably not more than 0.5 μm, more preferably not more than 100 nm, and still more preferably not more than 50 nm.

Any metal particles are applicable, provided that the diameter of the metal particle is not more than 0.5 μm, more preferably not more than 100 nm, and most preferably not more than 50 nm. The metal particles may have any shape, for example, spherical, flaky and needle-like. Colloidal metal particles, for example, those of silver or gold are specifically preferable.

The metal containing compound includes, for example, a metal oxide. As the metal oxide, materials having black color under a visible light or materials which are electro-conductive or semiconductive are applicable.

Examples of the materials having black color include black iron oxide ($Fe_3O_4$) and above mentioned black complex metal oxides containing two or more metal components.

Examples of the conductive or semiconductive materials include Sb-doped $SnO_2$ (ATO), Sn-doped $In_2O_3$ (ITO), $TiO_2$ and TiO(N) prepared by reducing $TiO_2$ (titanium oxide nitride, generally called "Titanium Black"). Particles prepared by covering a core material such as $BaSO_4$, $TiO_2$, $9Al_2O_3.2B_2O$ and $K_2O.nTiO_2$ with these metal oxides are also usable. The diameters of these oxide particles are not more than 0.5 μm, preferably not more than 100 nm, and more preferably not more than 50 nm.

Among these light-to-heat conversion materials, metal oxide particles are preferably used, and black iron oxide or black complex metal oxides containing at least two metal components are specifically preferable.

The black iron oxide ($Fe_3O_4$) particles preferably have an acicular ratio (major axis length/minor axis length) between 1 and 1.5. It is preferred that the black iron oxide particles are substantially spherical (having an acicular ratio of 1) or octahedral (having an acicular ratio of 1.4).

Examples of the black iron oxide particles include for example, TAROX series produced by Titan Kogyo K.K. Examples of the spherical particles include BL-100 (having a particle diameter of 0.2 to 0.6 μm, and BL-500 (having a particle diameter of 0.3 to 1.0 μm). Examples of the octahedral particles include ABL-203 (having a particle diameter of 0.4 to 0.5 μn), ABL-204 (having a particle diameter of 0.3 to 0.4 μm), ABL-205 (having a particle diameter of 0.2 to 0.3 μm), and ABL-207 (having a particle diameter of 0.2 μm).

The black iron oxide particles may be surface-coated with inorganic compounds, for example, $SiO_2$. Examples of such black iron oxide particles include spherical particles BL-200 (having a particle diameter of 0.2 to 0.3 μm) and octahedral particles ABL-207A (having a particle diameter of 0.2 μm), each having been surface-coated with $SiO_2$.

Examples of the black complex metal oxides containing two or more metal components include complex metal oxides containing at least two elements selected from Al, Ti, Cr, Mn, Fe, Co, Ni, Cu, Zn, Sb, and Ba. These can be prepared according to the methods disclosed in JP-A Nos. 8-27393, 9-25126, 9-237570, 9-241529 and 10-231441.

The complex metal oxide used in the present invention is preferably a complex Cu—Cr—Mn type metal oxide or a Cu—Fe—Mn type metal oxide. The Cu—Cr—Mn type metal oxide is preferably subjected to the treatment disclosed in JP-A No. 8-27393 in order to reduce solving out of hexavalent chromium ions.

The average diameters of the primary particles of these complex metal oxides are preferably not more than 1.0 μm, and more preferably 0.01 to 0.5 μm. By using particles having average primary particle diameter of not more than 1.0 μm, the light-to-heat conversion becomes more effective than when the same amount of larger particles are used. By using particles having average primary particle diameter of 0.01 to 0.5 μm, the light-to-heat conversion becomes further more effective. The amount of added light-to-heat conversion material is 0.1 to 80% by weight, preferably 1 to 60% by weight and further more preferably 3 to 50% by weight, based on the weight of the hydrophilic layer.

As for irradiation of infrared rays onto the hydrophilic layer in the heating process, any infrared ray generating apparatus may be used, provided that near-infrared to far-infrared rays of the wavelength: 750 nm to several tens of μm are generated. However, known infrared drying equipment is preferably used, for example, a ceramic panel heater and Astec Power Heater produced by Nihon Denka Kiko Co., Ltd.

The printing plate material of this embodiment contains a light-to-heat conversion material in the hydrophilic layer, and the hydrophilic layer of the exposed area generates heat during exposure to near-infrared to far-infrared lasers.

Accordingly, a thermal CTP system is structured by providing, on the hydrophilic layer, an image forming layer which enables thermal image formation.

Image formation may be a positive type or a negative type, where, in a positive type, the exposed portion of the image forming layer becomes easy to remove when heated, and, in a negative type, the exposed portion of the image forming layer becomes difficult to remove when heated.

One of the preferable embodiments of the present invention is a negative type printing plate material in which the exposed portion of the image forming layer becomes difficult to remove when heated, wherein the printing plate material is capable of on-press developing in which non-exposed portion of the image forming layer is removed by water or by ink on the printing press to reveal a hydrophilic layer.

(Image Formation Layer)

As the thermosensitive image formation layer in which the portion exposed to light becomes difficult to remove from the hydrophilic layer when heated, known is, for example, a thermosensitive image formation layer containing a hydrophobe precursor and a water-soluble or water-dispersible material, which will be described below.

As a hydrophobe precursor, applicable is a polymer which is capable of changing from hydrophilic (water-soluble or water-swellable) to hydrophobic by heating. Examples of the hydrophobe precursor include a polymer having an aryldiazosulfonate unit as disclosed in, for example, JP-A No. 2000-56449.

In the present invention, a microcapsule in which thermoplastic hydrophobic particles or a hydrophobic material is encapsuled, is preferably used as a hydrophobe precursor.

As thermoplastic microparticles, heat-melting microparticles and heat-fusible microparticles are listed.

The heat-melting microparticles used in the present invention include particles having a low melt viscosity, which are formed by using materials generally classified as wax. The heat-melting microparticles preferably have a softening point of 40° C. to 120° C. and a melting point of 60° C. to 150° C., and more preferably a softening point of 40° C. to 100° C. and a melting point of 60° C. to 120° C. A melting point less than 60° C. tends to result in problems of storage stability and the melting point exceeding 300° C. may cause lowering of ink receptive sensitivity.

Materials usable include, for example, paraffin wax, polyolefin wax, polyethylene wax, microcrystalline wax, and fatty acid based wax. The molecular weight thereof is approximately from 800 to 10,000. A polar group such as a hydroxyl group, an ester group, a carboxyl group, an aldehyde group and a peroxide group may be introduced into the wax by oxidation to increase the emulsification ability. Moreover, stearoamide, linolenamide, laurylamide, myristylamide, hardened cattle fatty acid amide, palmitamide, oleylamide, rice bran oil fatty acid amide, palm oil fatty acid amide, a methylol compound of the above-mentioned amide compounds, methylenebissteastearoamide and ethylenebissteastearoamide may be added to the wax to lower the softening point or to raise the working efficiency. A cumarone-indene resin, a rosin-modified phenol resin, a terpene-modified phenol resin, a xylene resin, a ketone resin, an acryl resin, an ionomer and a copolymer of these resins may also be usable.

Among them, one of polyethylene wax, microcrystalline wax, and fatty acid based wax is preferably contained. A high sensitive image formation can be performed since these materials each have a relatively low melting point and a low melt viscosity. Since each of these materials shows lubricity, the layer damage is minimized when a shearing force is applied to the surface layer of the printing plate precursor, and resistance to stain, which may be caused by scratch, is further enhanced.

The heat melting particles are preferably dispersible in water. The average particle diameter thereof is preferably from 0.01 to 10 μm, and more preferably from 0.1 to 3 μm. When the average particle diameter is smaller than 0.01 μm, on-press development may become insufficient and stain in non-image area may occur, because the heat-melting microparticles may be trapped in the micropores or in voids among the minute asperities of the surface of the hydrophilic layer. Alternatively, when the average particle diameter is larger than 10 μm, the resolution of the image may be degraded.

The composition of the heat-melting particles may be continuously varied from the interior to the surface of the particles. The particles may also be covered with a different material.

Known microcapsule production method or sol-gel method can be applied for covering the particles. The content of heat-melting particles in the thermosensitive image formation layer is preferably 1 to 90% by weight, and more preferably 5 to 80% by weight.

The heat fusible particles of the present invention include thermoplastic hydrophobic polymer particles. Although there is no specific limitation to the upper limit of the softening point of the thermoplastic hydrophobic polymer, the softening point is preferably lower than the decomposition temperature of the polymer. The weight average molecular weight (Mw) of the thermoplastic hydrophobic polymer is preferably in the range of 10,000 to 1,000,000.

Examples of the polymer consisting the polymer particles include a diene (co)polymer, for example, polypropylene, polybutadiene, polyisoprene or an ethylene-butadiene copolymer; a synthetic rubber, for example, a styrene-butadiene copolymer, a methyl methacrylate-butadiene copolymer or an acrylonitrile-butadiene copolymer; a (meth)acrylate (co)polymer or a (meth)acrylic acid (co) polymer, for example, polymethyl methacrylate, a methyl methacrylate-(2-ethylhexyl)acrylate copolymer, a methyl methacrylate-methacrylic acid copolymer, a methyl acrylate-(N-methylolacrylamide), or polyacrylonitrile; a vinyl ester (co)polymer, for example, a polyvinyl acetate, a vinyl acetate-vinyl propionate copolymer and a vinyl acetate-ethylene copolymer, or a vinyl acetate-2-hexylethyl acrylate copolymer; and polyvinyl chloride, polyvinylidene chloride, polystyrene and a copolymer thereof. Among them, the (meth)acrylate polymer, the (meth)acrylic acid (co)polymer, the vinyl ester (co)polymer, the polystyrene and the synthetic rubbers are preferably used.

The polymer microparticles may be prepared from a polymer synthesized by any known method such as an emulsion polymerization method, a suspension polymerization method, a solution polymerization method and a gas phase polymerization method. The microparticles of the polymer synthesized by the solution polymerization method or the gas phase polymerization method can be produced by (i) a method in which an organic solution of the polymer is sprayed into an inactive gas and dried, and (ii) a method in which the polymer is dissolved in a water-immiscible solvent, then the resulting solution is dispersed in water or an aqueous medium followed by removing the solvent by distillation. In both of the methods, a surfactant such as sodium lauryl sulfate, sodium dodecylbenzenesulfate or polyethylene glycol, or a water-soluble resin such as poly (vinyl alcohol) may be optionally used as a dispersing agent or stabilizing agent.

The heat fusible microparticles are preferably dispersible in water. The average particle diameter of the heat fusible particles is preferably 0.01 to 10 μm, and more preferably 0.1 to 3 μm. When the average particle diameter is smaller than 0.01 μm, on-press development may become insufficient and stain in non-image area may occur, because the heat-melting microparticles may be trapped in the micro pores or in voids among the minute asperities of the surface of the hydrophilic layer. Alternatively, when the average particle diameter is larger than 10 μm, the resolution of the image may be degraded.

Further, the composition of the heat fusible particles may be continuously varied from the interior to the surface of the particles. The particles may be covered with a different material.

As a covering method, known methods, for example, a microcapsule method and a sol-gel method are usable. The content of thermoplastic microparticles in the thermosensitive image formation layer is preferably 1 to 90% by weight, and more preferably 5 to 80% by weight.

<Microcapsules>

Microcapsules used in the printing plate material of the present invention include those encapsulating hydrophobic materials disclosed in, for example, JP-A Nos. 2002-2135 and 2002-19317.

The average microcapsule diameter is preferably from 0.1 to 10 μm, more preferably from 0.3 to 5 μm, and still more preferably from 0.5 to 3 μm.

The thickness of the microcapsule wall is preferably from 1/100 to 1/5 of the average microcapsule diameter, and more preferably from 1/50 to 1/10 of the average microcapsule diameter.

The microcapsule content in the image formation layer is preferably from 5 to 100% by weight, more preferably from 20 to 95% by weight, and still more preferably from 40 to 90% by weight.

As the materials for the microcapsule wall, known materials can be used. As a method of manufacturing the microcapsules, known methods can be used. The materials for the microcapsule wall and the manufacturing method of the microcapsule wall can be applied which are disclosed, for example, in Tamotsu Kondo, Masumi Koishi, "New Edition Microcapsule, Its Manufacturing Method, Properties And Application", published by Sankyo Shuppan Co., Ltd., or disclosed in literatures cited in it.

The following materials are usable for water soluble materials and water dispersive materials.

<Water Soluble Polymers>

Known polymers which are soluble or swellable in an aqueous solution of pH 4 to 10 are usable as a water soluble material to be contained in the image forming layer.

Specific example of the above described polymer include resins, for example, polysaccharides, polyethylene oxide, polypropylene oxide, polyvinyl alcohol, polyethylene glycol (PEG), polyvinyl ether, polyacrylic acid, a polyacrylic acid salt, polyacrylamide, and polyvinyl pyrrolidone.

Among these, polysaccharides, polyacrylic acid, polyacrylic acid salts or polyacrylamide are preferred.

Examples of the polysaccharides include starches, celluloses, polyuronic acid, pullulan, chitosan and derivatives thereof. Among these, cellulose derivatives such as a methyl cellulose salt, a carboxymethyl cellulose salt and a hydroxyethyl cellulose salt are preferred, and a sodium or ammonium salt of carboxymethyl cellulose is more preferred.

The polyacrylic acid preferably has a molecular weight of 3,000 to 1,000,000, and more preferably 5,000 to 500,000.

Among these, polyacrylic acid salts, for example, sodium polyacrylate is still more preferable. The polyacrylic acid salts are highly effective as a hydrophilization agent of the image formation layer, and a hydrophilic property of the hydrophilic layer surface is improved, which is revealed by on-press development of the thermosensitive image formation layer.

<Oligosaccharides>

An oligosaccharide may also be contained as a water-soluble material in addition to the above-mentioned water-soluble polymers.

Examples of an oligosaccharide include: raffinose, trehalose, maltose, galactose, sucrose, and lactose. Of these, trehalose is specifically preferable.

<Other Materials to be Contained in a Thermosensitive Image Formation Layer>

The thermosensitive image formation layer can contain an infrared absorbing dye as a light-to-heat conversion material. The content of the infrared absorbing dye in the image formation layer is preferably not less than 0.001 g/$m^2$ and less than 0.2 g/$m^2$, and more preferably less than 0.05 g/$m^2$ per unit area of a printing plate material. It is needless to say that a dye having lesser coloring degree is preferably used.

Specific examples of an infrared absorbing dye include the aforementioned dyes.

Moreover, an image forming layer can contain a surfactant. Si-based or F-based surfactants are suitably employed, however, Si-based surfactants are preferable with respect to preventing stains while printing. The content of the surfactant is preferably 0.01 to 3% by weight and more preferably 0.03 to 1% by weight based on the total weight of the hydrophilic layer (or on the solid content of the coating solution). The image formation layer in the present invention may contain an acid (phosphoric acid or acetic acid) or an alkali (sodium hydroxide, silicate, or phosphate) to adjust pH.

<On-press Developing Method>

According to one preferred embodiment of the present invention, in the printing plate material, the area imagewise exposed using an infrared laser forms an oleophilic image part, while non-exposed area of the image forming layer is removed to reveal a hydrophilic surface and forms the hydrophilic non-image part.

The image formation layer of the non-image part can be removed by washing with water, however, on-press development is also possible, in which the image forming layer of the non-image area is removed on a printing press using dampening solution or ink.

Removal on the press of the image formation layer at non-image parts (unexposed portions) of a printing plate material, which is mounted on the plate cylinder, can be carried out by bringing a dampening roller and an inking roller into contact with the image formation layer while rotating the plate cylinder, or by various sequences such as those described below or other appropriate sequences.

The supplied amount of dampening solution may be adjusted to be more or less than the amount ordinarily supplied during printing, and the adjustment may be carried out in steps or continuously.

(1) A dampening roller is brought into contact with the image formation layer of a printing plate material on the plate cylinder during one to several tens of rotations of the plate cylinder, and then an inking roller is brought into contact with the image formation layer during the next one to tens of rotations of the plate cylinder. Thereafter, printing is carried out.

(2) An inking roller is brought into contact with the image formation layer of a printing plate material on the plate cylinder during one to several tens of rotations of the plate cylinder, and then a dampening roller is brought into contact with the image formation layer during the next one to tens of rotations of the plate cylinder. Thereafter, printing is carried out.

(3) An inking roller and a dampening roller are brought into contact with the image formation layer of a printing plate material on the plate cylinder during one to several tens of rotations of the plate cylinder. Thereafter, printing is carried out.

EXAMPLES

The present invention will be explained below employing the following examples, however, the invention is not limited thereto. In the examples, "parts" is parts by weight, unless otherwise specifically specified.

(Preparation of Support 1)

Both surfaces of a 175 μm thick biaxially stretched polyester sheet were corona discharged at 8 W/$m^2$·minute. Then, one surface of the resulting sheet was coated with the following under coat layer coating solution a to give a first under coat layer with a dry thickness of 0.8 μm, and then coated with the following under coat layer coating solution b to give a second under coat layer with a dry thickness of 0.1 μm, while the first under coat layer was corona discharged at 8 W/$m^2$·minute, each layer was dried at 180° C. for 4 minutes (under coat layer A). Successively, the surface on the other side of the resulting sheet was coated with the following under coat layer coating solution c to give a third under coat layer with a dry thickness of 0.8 μm, and then coated with the following under coat layer coating solution d to give a fourth under coat layer with a dry thickness of 1.0 μm, while the third under coat layer was corona discharged at 8 W/$m^2$·minute, each layer was dried at 180° C. for 4 minutes (under coat layer B). Thus, support 1 having a under coat layer on each surface was prepared. The support 1 had a surface electric resistance at 25° C. and 25% RH of $10^8$Ω.

| <<Under Coat Layer Coating Solution a>> | |
|---|---|
| Latex of: styrene/glycidyl methacrylate/butyl acrylate (60/39/1 by mole) copolymer (Tg = 75° C.) (in terms of solid content) | 6.3 parts |
| Latex of: styrene/glycidyl methacrylate/butyl acrylate (20/40/40 by mole) copolymer (in terms of solid content) | 1.6 parts |
| Anionic surfactant S-1 | 0.1 part |
| Water | 92.0 parts |

| <<Under Coat Layer Coating Solution b>> | |
|---|---|
| Gelatin | 1 part |
| Anionic surfactant S-1 | 0.05 part |
| Hardener H-1 | 0.02 part |
| Matting agent (Silica particles with an average particle diameter of 3.5 μm) | 0.02 part |
| Antifungal agent F-1 | 0.01 part |
| Water | 98.9 parts |

S-1

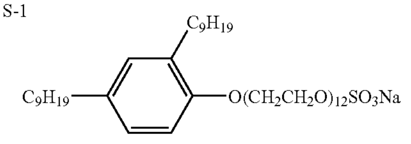

H-1

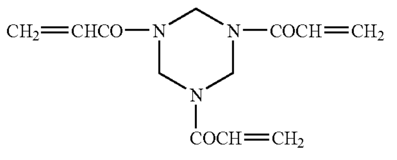

-continued

F-1

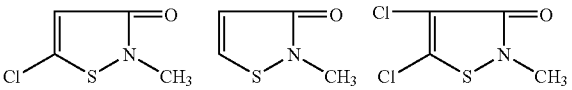

(Component A) (Component B) (Component C)

(Component A):(Component B):(Component C) = 50:46:4 (by mole)

<<Under Coat Layer Coating Solution c>>

| | |
|---|---|
| Latex of styrene/glycidyl methacrylate/butyl acrylate (20/40/40 by mole) copolymer (in terms of solid content) | 0.4 part |
| Latex of: styrene/glycidyl methacrylate/butyl acrylate/acetoacetoxyethyl methacrylate (39/40/20/1 by mole) copolymer | 7.6 parts |
| Anionic surfactant S-1 | 0.1 part |
| Water | 91.9 parts |

<<Under Coat Layer Coating Solution d>>

| | |
|---|---|
| Conductive composition of *Component d-1/**Component d-2/***Component d-3 (=66/31/1 by mole) | 6.4 parts |
| Hardener H-2 | 0.7 part |
| Anionic surfactant S-1 | 0.07 part |
| Matting agent (Silica particles with an average particle diameter of 3.5 μm) | 0.03 part |
| Water | 92.8 parts |

*Component d-1
Copolymer of: sodium styrene sulfonate/maleic acid (50/50 by mol) (Anionic polymer)
**Component d-2
Latex of: styrene/glycidyl methacrylate/butyl acrylate (40/40/20 by mole) copolymer
***Component d-3
Copolymer of: styrene/sodium isoprene sulfonate (80/20 by mole) (Polymer surfactant)

H-2

Mixture of three compounds below

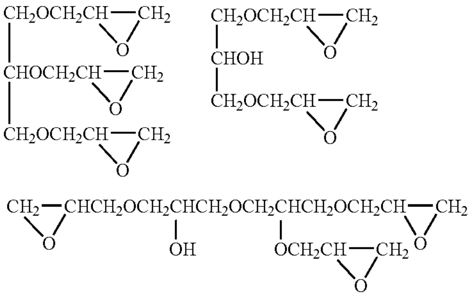

(Preparation of Support 2)

A 0.24 mm thick aluminum plate (1050, H16) was immersed in a 1% by weight sodium hydroxide aqueous solution at 50° C. to give an aluminum dissolution amount of 2 g/$m^2$, washed with water, immersed in a 0.1% by weight hydrochloric acid aqueous solution at 25° C. for 30 seconds to neutralize, and then washed with water.

Subsequently, the aluminum plate was subjected to an electrolytic surface-roughening treatment in an electrolytic solution containing 10 g/liter of hydrochloric acid and 0.5 g/liter of aluminum at a peak current density of 50 A/$dm^2$ employing an alternating current with a sine waveform, in which the distance between the plate surface and the electrode was 10 mm. The electrolytic surface-roughening treatment was divided into 10 treatments, in which the quantity of electricity used in one treatment (at a positive polarity) was 60 C/$dm^2$, and the total quantity of electricity used (at a positive polarity) was 600 C/$dm^2$. Standby time of 4 seconds, during which no surface-roughening treatment was carried out, was provided after each of the separate electrolytic surface-roughening treatments.

Subsequently, the resulting aluminum plate was immersed in a 1% by weight sodium hydroxide aqueous solution at 50° C. and etched to give an aluminum etching amount (including smut produced on the surface) of 2 g/$m^2$, washed with water, neutralized in a 10% by weight sulfuric acid aqueous solution at 25° C. for 10 seconds, and washed with water.

Subsequently, the aluminum plate was subjected to anodizing treatment in a 20% by weight sulfuric acid aqueous solution at a constant voltage of 20 V, in which a quantity of electricity of 150 C/$dm^2$ was supplied, and washed with water.

The washed surface of the plate was squeegeed to remove water on the surface, and the plate was immersed in a 0.5% by weight disodium hydrogen phosphate aqueous solution at 70° C. for 30 seconds, washed with water, and dried at 80° C. for 5 minutes. Thus, support 2 was obtained.

The surface roughness Ra of the support 2 was 0.7 μm.

(Measurement of Surface Roughness)

A platinum-rhodium layer with a thickness of 1.5 nm was vacuum-deposited onto a sample surface, and surface roughness was measured under condition of a magnification of 20, employing a non-contact three dimensional surface roughness measuring device RST plus produced by WYKO Co., Ltd., (in which the measurement area was 222.4 μm×299.4 μm). The resulting measurement was subjected to slope correction and to filtering treatment of Median Smoothing. Five portions of each sample were measured and the average of the measurements was defined as surface roughness Ra of the sample.

Example 1

(Preparation of Hydrophilic Layer Coated Support 1)

Materials of the composition shown in Table 1 were sufficiently mixed while stirring at 10000 rpm for 10 minutes, employing a homogenizer, and filtered to obtain hydrophilic layer coating solutions A with a solid content of 20% by weight. The pH value of coating solution A was 10.1. Composition of Hydrophilic Under Layer Coating Solution A (In Table 1, numerical values are parts by weight unless otherwise specified.)

TABLE 1

| Materials | Composition |
|---|---|
| Colloidal silica (alkali type): SNOWTEX XS (particle diameter: 4-6 nm, solid content: 20% by weight, produced by Nissan Kagaku Co., Ltd.) | 74.50 |
| Cu—Fe—Mn type metal oxide black pigment: TM-3550 black aqueous dispersion {prepared by dispersing TM-3550 black powder having a particle diameter of 0.1 μm produced by Dainichi Seika Kogyo Co., Ltd. in water to give a solid content of 40% by weight (including 0.2% by weight of dispersant)} | 3.50 |
| Layer structural clay mineral particles: Montmorillonite Mineral Colloid MO gel prepared by vigorously stirring montmorillonite Mineral Colloid MO; produced by Southern Clay Products Co., Ltd. (average particle diameter: 0.1 μm) in water in a homogenizer to give a solid content of 5% by weight | 8.00 |
| Sodium carboxymethylcellulose (produced by Kanto Kagaku) 4% by weight aqueous solution | 5.00 |
| 10% by weight sodium phosphate·dodecahydrate | 1.00 |

TABLE 1-continued

| Materials | Composition |
|---|---|
| aqueous solution (Reagent produced by Kanto Kagaku) | |
| Porous metal oxide particles: SILTON JC-40 (Porous aluminosilicate particles, average particle diameter: 4 μm, produced by Mizusawa Kagaku Co., Ltd.) | 3.00 |
| Pure water | 5.00 |

Next, materials of each composition as shown in Table 2 were mixed while stirring at 10000 rpm for 10 minutes, employing a homogenizer, and filtered to obtain hydrophilic upper layer coating solution B with a solid content of 20% by weight. The pH value of coating solution B was 9.8. Composition of Hydrophilic Upper Layer Coating Solution B (In Table 1, numerical values are parts by weight unless otherwise specified.)

TABLE 2

| Materials | Composition |
|---|---|
| Colloidal silica (alkali type): SNOWTEX S (particle diameter: 8-11 nm, solid content: 30% by weight, produced by Nissan Kagaku Co., Ltd.) | 17.20 |
| Necklace shaped colloidal silica (alkali type): SNOWTEX PSM (solid content 20% by weight, produced by Nissan Kagaku Co., Ltd.) | 38.70 |
| Cu—Fe—Mn type metal oxide black pigment: TM-3550 black aqueous dispersion {prepared by dispersing TM-3550 black powder having a particle diameter of 0.1 μm produced by Dainichi Seika Kogyo Co., Ltd. in water to give a solid content of 40% by weight (including 0.2% by weight of dispersant)} | 5.00 |
| Layer structural clay mineral particles: Montmorillonite Mineral Colloid MO gel prepared by vigorously stirring montmorillonite Mineral Colloid MO; produced by Southern Clay Products Co., Ltd. (average particle diameter: 0.1 μm) in water in a homogenizer to give a solid content of 5% by weight | 8.00 |
| Sodium carboxymethylcellulose (Reagent produced by Kanto Kagaku) 4% by weight aqueous solution | 5.00 |
| 10% by weight sodium phosphate·dodecahydrate aqueous solution (Reagent produced by Kanto Kagaku) | 1.00 |
| Porous metal oxide particles: SILTON AMT-08 (Porous aluminosilicate particles, average particle diameter: 0.6 μm, produced by Mizusawa Kagaku Co., Ltd.) | 2.40 |
| Porous metal oxide particles: SILTON JC-20 (Porous aluminosilicate particles, average particle diameter: 2 μm, produced by Mizusawa Kagaku Co., Ltd.) | 2.00 |
| Pure water | 20.70 |

Under coat layer A of support 1 was coated with coating solution A by means of a wire bar to form a hydrophilic under layer with a dried amount of 3.0 g/m$^2$, then, thus coated support 1 was put into a drying oven heated at 120° C. for 2 minutes, followed by taking out of the oven to cool down to an ambient temperature (20° C.). The surface temperature of the hydrophilic under layer, 2 minutes after putting into the oven, was 120° C. The surface temperature was measured by using a non-contact thermometer. Hereafter, the surface temperatures were measured in the same method.

The hydrophilic under layer thus prepared was further coated with coating solution B by means of a wire bar to form a hydrophilic upper layer with a dried amount of 0.7 g/m$^2$, then, the coated support 1 was put into a drying oven heated at 120° C. for 2 minutes, followed by taking out of the oven and cooling down to an ambient temperature (20° C.). Thus hydrophilic layer coated support 1 was obtained.

The surface temperature of the hydrophilic upper layer 2 minutes after putting into the oven was 120° C.

Hydrophilic layer coated support 1 and the printing plate material prepared by forming an image forming layer which will be described below on hydrophilic layer coated support 1 were stored at 20° C., except for when these plates were heated for drying or for aging. This storing condition was also common to other hydrophilic layer coated supports, unless otherwise specified.

(Preparation of Hydrophilic Layer Coated Support 2)

Hydrophilic layer coated support 2 was prepared in the same manner as hydrophilic layer coated support 1, except that the hydrophilic under layer and the hydrophilic upper layer were dried by putting them into a 170° C. drying oven for 5 minutes. The surface temperatures of the hydrophilic under layer and the hydrophilic upper layer, 5 minutes after putting into the drying oven, were 170° C.

(Preparation of Hydrophilic Layer Coated Support 3)

Hydrophilic layer coated support 3 was prepared by heat treating the hydrophilic layer coated support prepared in the same manner as hydrophilic layer coated support 1 at 200° C. for 2 minutes, followed by taking out of the oven to cool down to an ambient temperature (20° C.). Herein, in order to prevent thermal transformation of the hydrophilic layer coated support, the support was fixed on a flat aluminum plate when it was heat treated. The surface temperature of the hydrophilic upper layer, 2 minutes after putting into the drying oven, was 200° C.

(Preparation of Hydrophilic Layer Coated Support 4)

Materials of the composition shown in Table 3 were sufficiently mixed while stirring at 5000 rpm for 5 minutes, employing a homogenizer, and filtered to obtain hydrophilic layer coating solutions C (for the hydrophilic under layer) with a solid content of 30% by weight. The pH value of the coating solution C was 9.5.

Composition of Hydrophilic Under Layer Coating Solution A (In Table 3, numerical values are parts by weight unless otherwise specified.)

TABLE 3

| Materials | Composition |
|---|---|
| Metal oxide particles having light-to-heat conversion property: Black iron oxide particles ABL-207 (produced by Titan Kogyo K.K., octahedral form, average particle diameter: 0.2 μm, specific surface area: 6.7 m$^2$/g, Hc: 9.95 kA/m, σs: 85.7 Am$^2$/kg, σr/σs: 0.112) | 13.80 |
| Colloidal silica (alkali type): SNOWTEX XS (particle diameter: 4-6 nm, solid content: 20% by weight, produced by Nissan Kagaku Co., Ltd.) | 69.60 |
| Sodium phosphate·dodecahydrate 10% by weight aqueous solution (Reagent produced by Kanto Kagaku) | 1.50 |
| Chitosan particle dispersion (produced by Dainichi Seika Co., Ltd., average particle diameter: 2 μm, solid content: 6% by weight | 10.34 |
| Porous metal oxide particles: SILTON JC-50 (Porous aluminosilicate particles, average | 1.50 |

TABLE 3-continued

| Materials | Composition |
|---|---|
| particle diameter: 5 μm, produced by Mizusawa Kagaku Co., Ltd.) | |
| Surfactant: SURFYNOL 465 (produced by Air Products and Chemicals Inc.) 1% by weight aqueous solution. | 3.00 |
| Pure water | 0.26 |

Under coat layer A of support 1 was coated with coating solution C by means of a wire bar to form a hydrophilic layer coated support 4 with a dried amount of 4.5 g/m$^2$, then, thus coated support 4 was put into a drying oven heated at 120° C. for 2 minutes, followed by taking out of the oven to cool down to an ambient temperature (20° C.). The surface temperature of the hydrophilic under layer 2 minutes after putting into the oven was 120° C.

(Preparation of Hydrophilic Layer Coated Support 5)

Hydrophilic layer coated support 5 was prepared by heat treating the hydrophilic layer coated support prepared in the same manner as hydrophilic layer coated support 4 at 200° C. for 2 minutes, followed by taking out of the oven to cool down to an ambient temperature (20° C.). Herein, in order to prevent thermal transformation of the hydrophilic layer coated support, the support was fixed on a flat aluminum plate when it was heat treated. The surface temperature of the hydrophilic upper layer, 2 minutes after putting into the drying oven, was 200° C.

(Preparation of Hydrophilic Layer Coated Support 6)

Materials of the composition shown in Table 4 were sufficiently mixed and filtered to obtain hydrophilic layer coating solutions D with a solid content of 5% by weight. The pH value of the coating solution D was 9.6.

Composition of Hydrophilic Layer Coating Solution D (In Table 4, numerical values are parts by weight unless otherwise specified.)

TABLE 4

| Materials | Composition |
|---|---|
| Colloidal silica (alkali type): SNOWTEX XS (particle diameter: 4-6 nm, solid content: 20% by weight, produced by Nissan Kagaku Co., Ltd.) | 17.20 |
| Necklace shaped colloidal silica (alkali type): SNOWTEX PSM (solid content 20% by weight, produced by Nissan Kagaku Co., Ltd.) | 38.70 |
| Sodium carboxymethylcellulose (Reagent produced by Kanto Kagaku) 4% by weight aqueous solution | 5.00 |
| Sodium phosphate·dodecahydrate 10% by weight aqueous solution (Reagent produced by Kanto Kagaku) | 1.00 |
| Pure water | 20.70 |

A hydrophilic layer coated support prepared in the same manner as hydrophilic layer coated support 4 was further coated with coating solution D by means of a wire bar with a dried amount of 0.3 g/m$^2$ to form a hydrophilic layer coated support 5, then, thus coated support 5 was put into a drying oven heated at 170° C. for 5 minutes, followed by taking out of the oven to cool down to an ambient temperature (20° C.). The surface temperature of the hydrophilic layer, 5 minutes after putting into the oven, was 170° C.

(Preparation of Hydrophilic Layer Coated Support 7)

Materials of the composition shown in Table 5 were sufficiently mixed while stirring at 5000 rpm for 5 minutes, employing a homogenizer, and filtered to obtain hydrophilic layer coating solutions E (for the hydrophilic under layer) with a solid content of 30% by weight. The pH value of the coating solution E was 4.1.

Composition of Hydrophilic Layer Coating Solution E (In Table 5, numerical values are parts by weight unless otherwise specified.)

TABLE 5

| Materials | Composition |
|---|---|
| Metal oxide particles having light-to-heat conversion property: Black iron oxide particles ABL-207 (produced by Titan Kogyo K.K., octahedral form, average particle diameter: 0.2 μm, specific surface area: 6.7 m$^2$/g, Hc: 9.95 kA/m, σs: 85.7 Am$^2$/kg, σr/σs: 0.112) | 13.95 |
| Colloidal silica (acid type): SNOWTEX OS (particle diameter: 8-11 nm, solid content: 20% by weight, produced by Nissan Kagaku Co., Ltd.) | 72.60 |
| Porous metal oxide particles: SILTON JC-50 (Porous aluminosilicate particles, average particle diameter: 5 μm, produced by Mizusawa Kagaku Co., Ltd.) | 1.50 |
| Surfactant: SURFYNOL 465 (produced by Air Products and Chemicals Inc.) 1% by weight aqueous solution. | 3.00 |
| Pure water | 8.95 |

Under coat layer A of support 1 was coated with coating solution E by means of a wire bar with a dried amount of 4.5 g/m2 to form a hydrophilic layer coated support 7, then, thus coated support 7 was put into a drying oven heated at 120° C. for 2 minutes, followed by taking out of the oven to cool down to an ambient temperature (20° C.). The surface temperature of the hydrophilic layer, 2 minutes after putting into the oven, was 120° C.

(Preparation of Hydrophilic Layer Coated Support 8)

Hydrophilic layer coated support 8 was prepared by heat treating the hydrophilic layer coated support prepared in the same manner as hydrophilic layer coated support 7 at 200° C. for 2 minutes, followed by taking out of the oven to cool down to an ambient temperature (20° C.). Herein, in order to prevent thermal transformation of the hydrophilic layer coated support, the support was fixed on a flat aluminum plate when it was heat treated. The surface temperature of the hydrophilic upper layer, 2 minutes after putting into the drying oven, was 200° C.

(Preparation of Hydrophilic Layer Coated Support 9)

The hydrophilic layer coated support prepared in the same manner as hydrophilic layer coated support 4 was further heat treated at 200° C., where a resistance heater and an infrared heater were simultaneously used. Immediately after the surface temperature of the hydrophilic layer raised to 200° C., the hydrophilic layer coated support was taken out of the furnace to cool down to an ambient temperature (20° C.) to obtain hydrophilic layer coated support 9. The heat treatment duration was 1 minute and 30 seconds. No distinct damage (for example, thermal transformation) on the hydrophilic layer coated support was observed.

(Preparation of Printing Plate Material)

Materials of the composition shown in Table 6 were sufficiently mixed and filtered to obtain on-press developable image forming layer coating solutions F with a solid content of 10% by weight Image Forming Layer Coating Solution F (In Table 6, numerical values are parts by weight unless otherwise specified.)

TABLE 6

| Materials | Composition |
|---|---|
| Carnauba wax emulsion A118 (the wax having an average particle diameter of 0.3 μm, a softening point of 65° C., a melting point of 80° C., a melt viscosity at 140° C. of 8 cps, and having a solid content of 40% by weight, produced by Gifu Shellac Co., Ltd.) | 23.25 |
| Water soluble polymer: Aqueous solution of sodium polyacrylate: AQUALIC DL522 (solid content 30%, produced by Nippon Shokubai Co., Ltd.) | 2.33 |
| Pure water | 74.42 |

On the hydrophilic layer of each of hydrophilic layer coated supports 1 to 9, coating solution F was applied using a wire bar with a dried amount of 0.5 $g/m^2$, and the support was put in a drying oven to dry at 55° C. for 3 minutes, followed by taking out of the oven to cool down to an ambient temperature. The obtained supports were subjected to aging treatment in a 55° C. thermostatic oven for 24 hours to form printing plate materials 1 to 9 shown in Table 7.

(Image Formation Employing Infrared Laser)

Each of the resulting printing plate material samples was mounted and fixed on an exposure drum. Exposure was carried out using an infrared laser beam having a wavelength of 830 nm and a beam spot diameter of 18 μm at a resolution of 2400 dpi ("dpi" herein shows the number of dots per 2.54 cm) and at a screen line number of 175 to record an image. The recorded images included a solid image, a halftone(dot) image with a dot density of 1 to 99%, and a line and space image of 2400 dpi. The exposure energy was optimized for each printing plate material. The value of exposure energy suitable for each printing plate material is shown in Table 2.

(Printing Method)

Printing was carried out employing a printing press, DAIYA 1F-1 produced by Mitsubishi Jukogyo Co., Ltd., and employing a coated paper, a dampening solution of 2% by weight solution of Astromark 3 (produced by Nikken Kagaku Kenkyusyo Co., Ltd.), and printing ink (Toyo King Hy-Unity M Magenta, produced by Toyo Ink Manufacturing Co., Ltd.).

Each of the exposed printing plate material samples was mounted on a plate cylinder of the printing press, and printing was carried out in the same printing sequence as a conventional PS plate.

It took 3 days from the formation of the hydrophilic layer by coating to the evaluation of printing.

(Evaluation)

<Initial Printability>

The number of paper sheets printed before obtaining a good image print from the start of printing was determined, where a good image means a solid image with a density of 1.5 or more showing no stain in non-image area. The results were shown in Table 7.

<Printing Durability>

Printed image was observed in every 1000th print while printing 50000 sheets, and the number of paper sheets printed from the start of printing until when unevenness of the solid image or lack of dots at the 5% dot image was observed was counted and evaluated as a measure of printing durability. The results were shown in Table 7.

Table 7 revealed that the printing plate materials prepared according to the method of the present invention showed improved printing durability without loosing superior initial printability.

TABLE 7

| Printing Plate Material No. | Hydrophilic Layer Coated Support No. | Exposure Energy ($mJ/cm^2$) | Initial Printability (Sheets) | Printing Durability (Sheets) | Remarks |
|---|---|---|---|---|---|
| 1 | 1 | 300 | 10 | 35000 | Comp. |
| 2 | 2 | 300 | 10 | 45000 | Inv. |
| 3 | 3 | 300 | 10 | >50000 | Inv. |
| 4 | 4 | 200 | 10 | 40000 | Comp. |
| 5 | 5 | 200 | 10 | >50000 | Inv. |
| 6 | 6 | 200 | 10 | >50000 | Inv. |
| 7 | 7 | 200 | 20 | 10000 | Comp. |
| 8 | 8 | 200 | 20 | 15000 | Comp. |
| 9 | 9 | 200 | 10 | >50000 | Inv. |

Inv.: Inventive Sample,
Comp.: Comparative Sample

Example 2

(Preparation of Hydrophilic Layer Coated Support 10)

A grained surface of support 2 was coated with hydrophilic layer coating solution C, used in example 1, by means of a wire bar with a dried amount of 5.0 $g/m^2$ to form a hydrophilic layer coated support 10, then, thus coated support 10 was put into a drying oven heated at 120° C. for 2 minutes, followed by taking out of the oven to cool down to an ambient temperature (20° C.). The surface temperature of the hydrophilic layer, 2 minutes after putting into the oven, was 120° C.

(Preparation of Hydrophilic Layer Coated Support 11)

The hydrophilic layer of a hydrophilic layer coated support, which was prepared in the same manner as hydrophilic layer coated support 10, was coated with hydrophilic layer coating solution D, used in example 1, by means of a wire bar with a dried amount of 0.3 $g/m^2$ to form a hydrophilic layer coated support 11, then, thus coated support 11 was put into a drying oven heated at 120° C. for 2 minutes, followed by taking out of the oven to cool down to an ambient temperature (20° C.). The surface temperature of the hydrophilic layer, 2 minutes after putting into the oven, was 120° C.

(Preparation of Hydrophilic Layer Coated Support 12)

Hydrophilic layer coated support 12 was prepared by heat treating the hydrophilic layer coated support, which was prepared in the same manner as hydrophilic layer coated support 10, at 250° C. for 1 minute, followed by taking out of the oven to cool down to an ambient temperature (20° C.). The surface temperature of the hydrophilic upper layer, 1 minute after putting into the drying oven, was 250° C.

(Preparation of Hydrophilic Layer Coated Support 13)

The hydrophilic layer coated support prepared in the same manner as hydrophilic layer coated support 10 was further heat treated at 280° C., where a resistance heater and an infrared heater were simultaneously used. Immediately after the surface temperature of the hydrophilic layer was raised to 280° C., the hydrophilic layer coated support was taken out of the furnace to cool down to an ambient temperature (20° C.) to obtain hydrophilic layer coated support 13. The heat treatment duration was 2 minutes.

(Preparation of Hydrophilic Layer Coated Support 14)

Hydrophilic layer coated support 14 was prepared by heat treating the hydrophilic layer coated support, which was prepared in the same manner as hydrophilic layer coated support 11, at 250° C. for 1 minute, followed by taking out of the oven to cool down to an ambient temperature (20° C.). The surface temperature of the hydrophilic upper layer, 1 minute after putting into the drying oven, was 250° C.

(Image Forming by Means of Ink-Jet Printing)

[Preparation of Ink-Jet Ink]

A dispersed solution of the following composition was prepared. The average diameter of the dispersed particle was 0.2 to 0.3 μm.

| Magenta pigment dispersion composirion | |
|---|---|
| Pigment red 57:1 | 15 weight parts |
| Polymer dispersing agent | 5 weight parts |
| Stearyl acrylate | 80 weight parts |

Subsequently, a magenta ink of the following composition was prepared by mixing and filtering using a filter with an absolute filtration rating of 2 μm. The viscosity of the ink at 25° C. was 120 mPa·s, the viscosity at 70° C. was 15 mpa·s. The surface tension at 25° C. was 250 μN/cm.

Magenta Ink 1

| | |
|---|---|
| Magenta pigment dispersion composition | 20 weight parts |
| Stearyl acrylate | 60 weight parts |
| difunctional aromatic urethane acrylate (molecular weight 1500) | 10 weight parts |
| hexafunctional aliphatic urethane acrylate (molecular weight 1000) | 5 weight parts |
| Initiator (Irgacure 184 produced by Ciba Specialty Chemicals Inc.) | 5 weight parts |

[Image Formation]

Image formation on hydrophilic layer coated supports 10 to 14 was carried out by using an ink-jet recording instrument provided with piezo ink-jet nozzles. The ink supply system included an ink tank, a supply pipe, a pre-chamber ink tank just before a head, a piping equipped with a filter, and a piezo-head, and the portion from the pre-chamber tank to the head was thermally insulated and heated. Temperature sensors were equipped at the pre-chamber ink tank and at a vicinity of the nozzles of the piezo head, and the temperature was controlled so that the nozzle area were constantly kept within 60±2° C. The diameter of the nozzle was 24 μm. The piezo-head was driven so as to eject multi-size ink droplets of 8 to 30 pl at a resolution of 720 dpi×720 dpi (dpi represents a dot number per 2.54 cm).

UV-A light was focused to give an illuminance of 100 mW/cm2 at the exposing surface, and the exposure system, main-scanning rate and ejecting frequency were adjusted so that exposure started 0.1 second after ink-jet ink reached the recording material.

Ejection was carried out at environmental temperature of 25° C. using the above described ink, immediately after the ejection, UV light was irradiated. The exposure energy of the irradiation was 300 $mJ/cm^2$.

The formed images were a solid image and a dot image of which dot diameter was 40 μm.

(Printing Method)

30000 sheets of printing was carried out in the same manner as example 1, except that high quality printing paper ("Shiraoi") was used, and the printing pressure was raised by using a thicker underlay sheet of 50 μm.

It took 3 days from the formation of the hydrophilic layer by coating to the evaluation of printing.

(Evaluation of Printing)

[Evaluation of Hydrophilic Layer Abrasion]

Surface roughness of the non-image part of the hydrophilic layer before printing and after 30000 sheets printing was measured, and the difference in the surface roughness was used for evaluating the abrasion of the hydrophilic layer. Measurement of the surface roughness was carried out by using WYKO RST Plus.

The following parameters obtained from the data were used for evaluation: (i) Ra (center line average roughness); (ii) Rz (ten point height of irregularities); (iii) Rpm (a parameter showing portions above the center line (face) of Rz), and (iv) Rvm (a parameter showing portions below the center line (face) of Rz which is a negative value).

Extent of decrease in Rpm and Rvm values is considered to be related to the amount of abrasion of the hydrophilic layer. When larger particles (around 5 μm in diameter) in the hydrophilic layer drop off from the surface, Rpm value decreases due to decrease in the number of protrusions, and Rvm value also decreases due to increase in the pits formed by the drop off of the particles. Accordingly, the larger decreases in Rpm and Rvm values show the larger extent of abrasion. The results were shown in Table 8.

Printed image was observed in every 1000th print, and the number of paper sheets printed from the start of printing until when unevenness of the solid image or lack of dots at the dot image was observed was counted and evaluated as a measure of printing durability. The results are shown in Table 8.

Table 8 revealed that the printing plate materials prepared by the method of the present invention showed smaller extent of abrasion of the hydrophilic layer as well as a largely improved printing durability, even under severe printing conditions.

TABLE 8

| Printing Plate Material | Hydrophilic Layer Coated Support | Hydrophilic Layer Surface Roughness Before Printing (nm) | | | | Hydrophilic Layer Surface Roughness After Printing (nm) | | | | Hydrophilic Layer Surface Roughness After Printing - Before Printing (nm) | | | | Printing Durability | |
|---|---|---|---|---|---|---|---|---|---|---|---|---|---|---|---|
| No. | No. | Ra | Rz | Rpm | Rvm | Ra | Rz | Rpm | Rvm | Ra | Rz | Rpm | Rvm | (Sheets) | Remarks |
| 10 | 10 | 480 | 5870 | 3510 | −2360 | 470 | 6340 | 3090 | −3250 | −10 | 470 | −420 | −890 | 9000 | Comp. |
| 11 | 11 | 510 | 6220 | 3390 | −2830 | 480 | 6510 | 2840 | −3670 | −30 | 290 | −550 | −840 | 12000 | Comp. |
| 12 | 12 | 490 | 6130 | 3430 | −2700 | 480 | 6270 | 3350 | −2920 | −10 | 140 | −80 | −220 | >30000 | Inv. |
| 13 | 13 | 490 | 6050 | 3370 | −2680 | 480 | 6140 | 3310 | −2830 | −10 | 90 | −60 | −150 | >30000 | Inv. |
| 14 | 14 | 520 | 6170 | 3360 | −2810 | 500 | 6270 | 3250 | −3020 | −20 | 100 | −110 | −210 | >30000 | Inv. |

Inv.: Inventive Sample,
Comp.: Comparative Sample

What is claimed is:

1. A method for preparing a printing plate material containing a substrate having thereon a hydrophilic layer, comprising the steps of:

(i) applying on the substrate an aqueous coating solution for the hydrophilic layer, the coating solution containing colloid of spherical metal oxide particles and having a pH value of 8 to 12 to obtain a coating layer; and (ii) heating the printing plate material so that a surface temperature of the coated layer is raised to 130 to 300° C., so as to dry the coated layer.

2. The method of the claim 1, wherein the spherical metal oxide particles are colloidal silica.

3. The method of claim 1, wherein diameters of the spherical metal oxide particles are in the range of 1 to 15 nm.

4. The method of claim 1, wherein the aqueous coating solution for the hydrophilic layer contains a light-to-heat conversion material and in the step (ii), the heating is carried out by irradiating with infra-red rays.

5. The method of claim 4, wherein the light-to-heat conversion material is made of particles of carbon black, graphite, metal or a metal containing compound.

6. The method of claim 5, wherein the metal containing compound is a metal oxide.

7. The method of claim 1, wherein the support is a plastic film.

8. The printing plate material comprising: a substrate having thereon a hydrophilic layer, wherein the printing plate material is prepared by the method of claim 1.

* * * * *